United States Patent
Miyairi et al.

(10) Patent No.: US 8,440,548 B2
(45) Date of Patent: May 14, 2013

(54) MANUFACTURING METHOD OF MICROCRYSTALLINE SILICON FILM AND MANUFACTURING METHOD OF THIN FILM TRANSISTOR

(75) Inventors: Hidekazu Miyairi, Kanagawa (JP); Takashi Ienaga, Kanagawa (JP); Masao Moriguchi, Osaka (JP); Yosuke Kanzaki, Osaka (JP)

(73) Assignees: Semiconductor Energy Laboratory Co., Ltd., Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 63 days.

(21) Appl. No.: 13/185,742

(22) Filed: Jul. 19, 2011

(65) Prior Publication Data
US 2012/0034765 A1   Feb. 9, 2012

(30) Foreign Application Priority Data
Aug. 6, 2010  (JP) ................................ 2010-177922

(51) Int. Cl.
*H01L 21/20* (2006.01)
*H01L 21/36* (2006.01)

(52) U.S. Cl.
USPC ................ 438/479; 438/149; 257/E29.292

(58) Field of Classification Search ............ 257/E29.292
See application file for complete search history.

(56) References Cited

U.S. PATENT DOCUMENTS

| 4,409,134 | A | 10/1983 | Yamazaki |
| 5,537,929 | A | 7/1996 | Miura et al. |
| 5,564,339 | A | 10/1996 | Miura et al. |
| 5,834,827 | A | 11/1998 | Miyasaka et al. |

(Continued)

FOREIGN PATENT DOCUMENTS

| CN | 1129492 A | 8/1996 |
| CN | 1245972 A | 3/2000 |

(Continued)

OTHER PUBLICATIONS

International Search Report (Application No. PCT/JP2011/067017), dated Oct. 25, 2011.

(Continued)

*Primary Examiner* — Daniel Whalen
(74) *Attorney, Agent, or Firm* — Nixon Peabody LLP; Jeffrey L. Costellia (57) ABSTRACT

An object is to provide a manufacturing method of a microcrystalline silicon film with improved adhesion between an insulating film and the microcrystalline silicon film. The microcrystalline silicon film is formed in the following manner. Over an insulating film, a microcrystalline silicon grain having a height that allows the microcrystalline silicon grain to be completely oxidized by later plasma oxidation (e.g., a height greater than 0 nm and less than or equal to 5 nm), or a microcrystalline silicon film or an amorphous silicon film having a thickness that allows the microcrystalline silicon film or the amorphous silicon film to be completely oxidized by later plasma oxidation (e.g., a thickness greater than 0 nm and less than or equal to 5 nm) is formed. Plasma treatment in an atmosphere including oxygen or plasma oxidation is performed on the microcrystalline silicon grain, the microcrystalline silicon film, or the amorphous silicon film, so that a silicon oxide grain or a silicon oxide film is formed over the insulating film. A microcrystalline silicon film is formed over the silicon oxide grain or the silicon oxide film.

4 Claims, 7 Drawing Sheets

U.S. PATENT DOCUMENTS

| | | | |
|---|---|---|---|
| 5,858,819 A | 1/1999 | Miyasaka | |
| 6,017,779 A | 1/2000 | Miyasaka | |
| 6,078,059 A * | 6/2000 | Nakata | 257/57 |
| 6,107,639 A | 8/2000 | Yamazaki et al. | |
| 6,335,542 B2 | 1/2002 | Miyasaka | |
| 6,515,299 B1 | 2/2003 | Yamazaki et al. | |
| 6,720,575 B2 | 4/2004 | Yamazaki et al. | |
| 6,972,433 B2 | 12/2005 | Miyasaka | |
| 7,022,590 B2 | 4/2006 | Yamazaki et al. | |
| 7,307,007 B2 | 12/2007 | Yamazaki et al. | |
| 7,611,930 B2 | 11/2009 | Yamazaki et al. | |
| 7,736,933 B2 | 6/2010 | Arai et al. | |
| 7,842,586 B2 | 11/2010 | Yamazaki | |
| 2001/0013607 A1 | 8/2001 | Miyasaka | |
| 2001/0032986 A1 | 10/2001 | Miyasaka | |
| 2003/0062522 A1 | 4/2003 | Yamazaki et al. | |
| 2004/0132233 A1 | 7/2004 | Yamazaki et al. | |
| 2006/0172471 A1 | 8/2006 | Yamazaki et al. | |
| 2006/0199384 A1 | 9/2006 | Ando et al. | |
| 2006/0240602 A1 * | 10/2006 | Roca I Cabarrocas et al. | 438/149 |
| 2009/0011551 A1 | 1/2009 | Yamazaki | |
| 2009/0029498 A1 | 1/2009 | Yamazaki et al. | |
| 2009/0047752 A1 | 2/2009 | Yamazaki et al. | |
| 2009/0236600 A1 * | 9/2009 | Yamazaki et al. | 257/59 |
| 2010/0323501 A1 | 12/2010 | Yamazaki et al. | |
| 2011/0039402 A1 | 2/2011 | Yamazaki et al. | |

FOREIGN PATENT DOCUMENTS

| | | |
|---|---|---|
| CN | 1495857 A | 5/2004 |
| CN | 1495869 A | 5/2004 |
| EP | 0 714 140 A1 | 5/1996 |
| EP | 1 335 419 A2 | 8/2003 |
| EP | 1 722 403 A2 | 11/2006 |
| JP | 01-288828 | 11/1989 |
| JP | 06-132531 | 5/1994 |
| JP | 11-354445 | 12/1999 |
| JP | 2005-167280 | 6/2005 |
| JP | 2005-203800 | 7/2005 |
| JP | 2005-294859 | 10/2005 |
| JP | 2006-279019 | 10/2006 |
| JP | 2009-044171 | 2/2009 |
| KR | 10-0701815 B1 | 4/2007 |
| WO | WO 95/34916 A1 | 12/1995 |

OTHER PUBLICATIONS

Written Opinion (Application No. PCT/JP2011/067017), dated Oct. 25, 2011.

* cited by examiner

MANUFACTURING METHOD OF MICROCRYSTALLINE SILICON FILM AND MANUFACTURING METHOD OF THIN FILM TRANSISTOR

TECHNICAL FIELD

The present invention relates to a manufacturing method of a microcrystalline silicon film and a manufacturing method of a thin film transistor.

BACKGROUND ART

For conventional liquid crystal televisions, amorphous silicon TFTs (thin film transistors) are used in many cases and recognized as structures that can be relatively easily manufactured in terms of manufacturing cost.

However, under current moving image circumstances (e.g., 3D movies or 3D sports broadcast), it is difficult to clearly express moving images with liquid crystal televisions including amorphous silicon TFTs; accordingly, TFTs having high mobility that can respond at high speed are under development. For this reason, a microcrystalline silicon film has been developed.

It is known that the field-effect mobility ($\mu FE\_sat.$) of a thin film transistor in which only a microcrystalline silicon film is employed for a channel formation region is higher than that of an amorphous silicon TFT; however, the crystallization may proceed excessively and the off-leakage current ($I_{off}$) may be increased in such a transistor. Therefore, optimization of crystallinity is an issue.

The crystallinity of a microcrystalline silicon film can be increased, for example, under conditions in which monosilane ($SiH_4$) and hydrogen ($H_2$) are introduced into a parallel-plate plasma CVD (chemical vapor deposition) apparatus at an oscillation frequency of 13.56 MHz, the hydrogen flow rate is high, and the RF power is low.

Note that it is preferable to set the substrate temperature at film formation to approximately 200° C. to 300° C. for suppressing shrinkage (expression and contraction) of a glass substrate and increasing the gas decomposition efficiency at the time of plasma discharge.

In the case where a $SiN_x$ film is used as a gate insulating film of a thin film transistor and a microcrystalline silicon film serving as an active layer is formed over the $SiN_x$ film, the adhesion force between the microcrystalline silicon film and the $SiN_x$ film is low; as a result, a film bulge or film peeling tends to occur.

In the case of the above-described conventional conditions, the crystallinity tends to be low at an early growth stage of microcrystalline silicon and be improved as the deposition proceeds.

In order to solve these problems, in some cases, for example, $N_2O$ plasma treatment is performed on a surface of the $SiN_x$ film before forming the microcrystalline silicon film over the $SiN_x$ film for the purpose of securing reliability and adhesion at an interface between the active layer and the gate insulating film.

With such $N_2O$ plasma treatment, the adhesion between the microcrystalline silicon film and the $SiN_x$ film is somewhat improved but is still insufficient.

[Reference]
[Patent Document]
[Patent Document 1] Japanese Published Patent Application No. 2006-279019

[Patent Document 2] Japanese Published Patent Application No. H06-132531

DISCLOSURE OF INVENTION

It is an object of one embodiment of the present invention to provide a manufacturing method of a microcrystalline silicon film with improved adhesion between an insulating film and the microcrystalline silicon film. Further, it is another object of one embodiment of the present invention to provide a manufacturing method of a thin film transistor with improved adhesion between a gate insulating film and a microcrystalline silicon film.

One embodiment of the present invention is a manufacturing method of a microcrystalline silicon film, which includes the steps of: forming, over an insulating film, a microcrystalline silicon grain having a height that allows the microcrystalline silicon grain to be completely oxidized by later plasma oxidation or the like (e.g., a height greater than 0 nm and less than or equal to 5 nm), or a microcrystalline silicon film or an amorphous silicon film having a thickness that allows the microcrystalline silicon film or the amorphous silicon film to be completely oxidized by later plasma oxidation or the like (e.g., a thickness greater than 0 nm and less than or equal to 5 nm); performing plasma treatment in an atmosphere including oxygen or plasma oxidation on the microcrystalline silicon grain, the microcrystalline silicon film, or the amorphous silicon film, so that a silicon oxide grain or a silicon oxide film is formed over the insulating film; and forming a microcrystalline silicon film over the silicon oxide grain or the silicon oxide film.

In the above embodiment of the present invention, by performing the plasma treatment in an atmosphere including oxygen on the microcrystalline silicon grain, the silicon oxide grain having high crystallinity can be formed over the insulating film. Further, by forming the microcrystalline silicon film over the silicon oxide grain having high crystallinity, the adhesion force between the insulating film and the microcrystalline silicon film can be increased.

Further, in the above embodiment of the present invention, the insulating film is a single-layer film or a stacked film including any of a silicon nitride film or a silicon nitride oxide film. Note that the silicon nitride oxide film is a film in which the nitrogen content is higher than the oxygen content.

Another embodiment of the present invention is a manufacturing method of a thin film transistor, which includes the steps of: forming a gate insulating film over a gate electrode; forming, over the gate insulating film, a microcrystalline silicon grain having a height that allows the microcrystalline silicon grain to be completely oxidized by later plasma oxidation or the like (e.g., a height greater than 0 nm and less than or equal to 5 nm), or a microcrystalline silicon film or an amorphous silicon film having a thickness that allows the microcrystalline silicon film or the amorphous silicon film to be completely oxidized by later plasma oxidation or the like (e.g., a thickness greater than 0 nm and less than or equal to 5 nm); performing plasma treatment in an atmosphere including oxygen or plasma oxidation on the microcrystalline silicon grain, the microcrystalline silicon film, or the amorphous silicon film, so that a silicon oxide grain or a silicon oxide film is formed over the gate insulating film; and forming a microcrystalline silicon film over the silicon oxide grain or the silicon oxide film. Note that the thin film transistor includes the microcrystalline silicon film including a source region, a drain region, and a channel region.

In the above embodiment of the present invention, the gate insulating film is a single-layer film or a stacked film including any of a silicon nitride film or a silicon nitride oxide film.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the spirit and scope of the present invention. Therefore, the invention should not be construed as being limited to the description in the following embodiments.

[Embodiment 1]

In this embodiment, a manufacturing method of a microcrystalline silicon film with improved adhesion between an insulating film and the microcrystalline silicon film will be described with reference to FIGS. 1A and 1B.

Figure 1A:
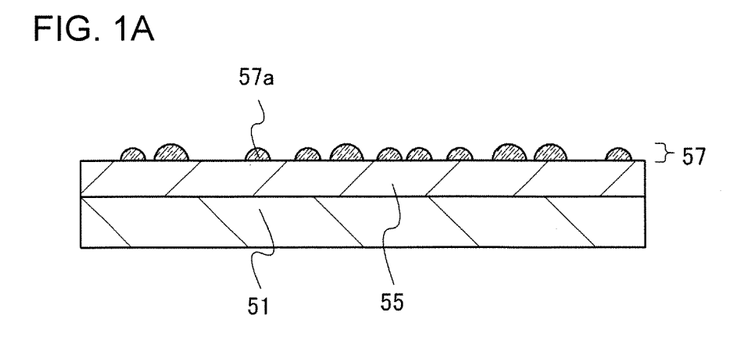
FIGS. 1A and 1B are cross-sectional views illustrating a manufacturing method of a microcrystalline silicon film with improved adhesion between an insulating film and the microcrystalline silicon film according to one embodiment of the present invention.

As illustrated in FIG. 1A, an insulating film 55 is formed over a substrate 51, and plasma treatment in an atmosphere including oxygen or plasma oxidation is performed on a surface of the insulating film 55. Next, a microcrystalline silicon grain having a height that allows the microcrystalline silicon grain to be completely oxidized by later plasma oxidation or the like (e.g., a height greater than 0 nm and less than or equal to 5 nm) is formed over the insulating film 55 by a plasma CVD method, and the microcrystalline silicon grain is subjected to plasma treatment in an atmosphere including oxygen or plasma oxidation; thus, a silicon oxide grain 57a having high crystallinity is formed over the insulating film 55. As the plasma treatment in an atmosphere including oxygen, $N_2O$ plasma treatment may be used, for example. The formation of a microcrystalline silicon grain and the plasma treatment may be repeated as needed.

The silicon oxide grain 57a is formed over the insulating film 55 by forming the microcrystalline silicon grain over the insulating film 55 in this embodiment. However, a silicon oxide film (a $SiO_x$ film) having high crystallinity may be alternatively formed over the insulating film 55 by forming a microcrystalline silicon film or an amorphous silicon film having a thickness that allows the microcrystalline silicon film or the amorphous silicon film to be completely oxidized by later plasma oxidation or the like (e.g., a thickness greater than 0 nm and less than or equal to 5 nm) over the insulating film 55 by a plasma CVD method and performing plasma treatment in an atmosphere including oxygen or plasma oxidation on the microcrystalline silicon film or the amorphous silicon film. In the case of using an amorphous silicon film, it is preferable to use silicon in which crystallization is suppressed.

As the substrate 51, a glass substrate, a ceramic substrate, or the like can be used. Note that there is no limitation on the size of the substrate 51. For example, any of glass substrates of the 3rd to 10th generations which are often used in the field of flat panel displays can be used.

The insulating film 55 can be formed as a single layer or a stacked layer using a silicon nitride film (a $SiN_x$ film) or a silicon nitride oxide film (a SiNO film) by a CVD method, a sputtering method, or the like.

Although the $N_2O$ plasma treatment is performed on the surface of the insulating film 55 in this embodiment, the $N_2O$ plasma treatment is not always necessary.

The microcrystalline silicon grain is formed in a treatment chamber of a plasma CVD apparatus, using plasma generated by glow discharge with the use of a mixture of a deposition gas containing silicon and hydrogen as a source gas. Alternatively, the microcrystalline silicon grain may be formed using plasma generated by glow discharge with the use of a mixture of a deposition gas containing silicon, hydrogen, and a rare gas such as helium, neon, or krypton. The distance between an upper electrode and a lower electrode of the plasma CVD apparatus is set to a distance which allows generation of plasma, and may be approximately 1 mm to 200 mm, preferably approximately 5 mm to 50 mm. The optimum distance can vary with various film formation conditions.

As typical examples of the deposition gas containing silicon, there are $SiH_4$, $Si_2H_6$, and the like.

A rare gas such as helium, argon, neon, krypton, or xenon may be mixed into the source gas of the microcrystalline silicon grain.

In the glow discharge at the time of forming the microcrystalline silicon grain, the plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the ratio of the flow rate of hydrogen to the flow rate of the deposition gas containing silicon.

Figure 1B:
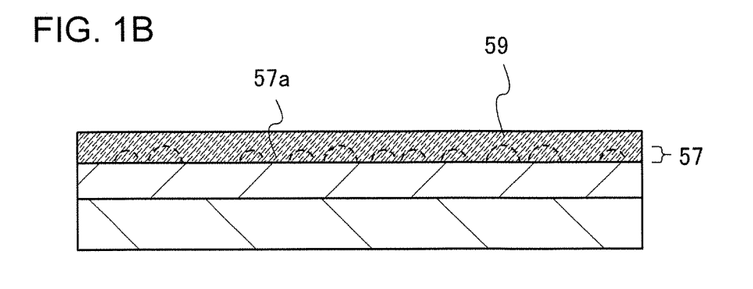

Next, as illustrated in FIG. 1B, a microcrystalline silicon film 59 is formed over the silicon oxide grain 57a.

The microcrystalline silicon film 59 is formed in a treatment chamber of the plasma CVD apparatus, using plasma generated by glow discharge with the use of a mixture of a deposition gas containing silicon and hydrogen as a source gas. Alternatively, the microcrystalline silicon film 59 is formed using plasma generated by glow discharge with the use of a mixture of a deposition gas containing silicon, hydrogen, and a rare gas such as helium, neon, or krypton. The distance between an upper electrode and a lower electrode of the plasma CVD apparatus may be set to a distance which allows generation of plasma.

In the case where a rare gas such as helium, argon, neon, krypton, or xenon is mixed into the source gas of the microcrystalline silicon film 59, the crystallinity of the microcrystalline silicon film 59 can be improved in a manner similar to that of the microcrystalline silicon grain.

The conditions for generating plasma by glow discharge at the time of forming the microcrystalline silicon grain can be employed as appropriate as conditions for the microcrystalline silicon film 59. In the case where the conditions for generating plasma by glow discharge at the time of forming the microcrystalline silicon grain and those at the time of forming the microcrystalline silicon film 59 are the same, throughput can be increased; however, they may be different from each other.

In this embodiment, by performing the plasma treatment in an atmosphere including oxygen or the plasma oxidation on the microcrystalline silicon grain, the silicon oxide grain 57a having high crystallinity can be formed over the insulating film 55. Then, the microcrystalline silicon film 59 is formed over the silicon oxide grain 57a having high crystallinity, so that a contact portion at the interface between the insulating film 55 and the microcrystalline silicon film 59 can be well-ordered. Accordingly, the adhesion force or the adhesion between the insulating film 55 and the microcrystalline silicon film 59 can be increased or improved. As the result, a film bulge or film peeling of the microcrystalline silicon film 59 hardly occurs.

The microcrystalline silicon grain and the microcrystalline silicon film 59 are formed of microcrystalline silicon. Note that microcrystalline silicon is a semiconductor having an intermediate structure between an amorphous structure and a crystalline structure (including single crystal and polycrystal). In the microcrystalline silicon, columnar or needle-like crystal grains having a grain size of 2 nm to 200 nm, preferably 10 nm to 80 nm, further preferably 20 nm to 50 nm, still further preferably 25 nm to 33 nm have grown in a direction normal to the substrate surface. Therefore, there are some cases in which a crystal grain boundary is formed at the interface between the columnar or needle-like crystal grains.

The Raman spectrum of microcrystalline silicon is shifted to a smaller wave-number region than 520 cm$^{-1}$ which represents single crystal silicon. That is, the peak of the Raman spectrum of the microcrystalline silicon exists between 520 cm$^{-1}$ which represents single crystal silicon and 480 cm$^{-1}$ which represents amorphous silicon. Microcrystalline silicon includes at least 1 atomic % or more of hydrogen or halogen to terminate a dangling bond. Moreover, the microcrystalline silicon may contain a rare gas element such as helium, argon, krypton, or neon to further promote lattice distortion, so that stability is increased and favorable microcrystalline silicon can be obtained. Such microcrystalline silicon is disclosed in, for example, U.S. Pat. No. 4,409,134.

[Embodiment 2]

In this embodiment, a manufacturing method of a thin film transistor formed in a semiconductor device according to one embodiment of the present invention will be described with reference to FIGS. 2A to 2D, FIGS. 3A and 3B, and FIGS. 4A to 4C. Note that an n-channel thin film transistor has higher carrier mobility than a p-channel thin film transistor. In this embodiment, a manufacturing method of an n-channel thin film transistor will be described.

Figure 2A:
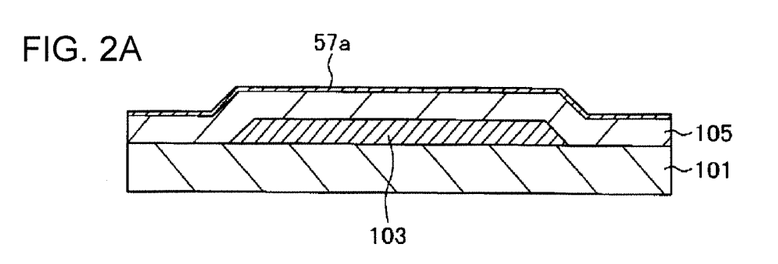
FIGS. 2A to 2D are cross-sectional views illustrating a manufacturing method of a semiconductor device according to one embodiment of the present invention.

As illustrated in FIG. 2A, a gate electrode 103 is formed over a substrate 101. Then, a gate insulating film 105 which is formed of a silicon nitride film (a SiN$_x$ film) and covers the gate electrode 103 (hereinafter also referred to as a first gate electrode) is formed, and N$_2$O plasma treatment is performed on a surface of the gate insulating film 105. Next, a microcrystalline silicon grain having a height that allows the microcrystalline silicon grain to be completely oxidized by later plasma oxidation or the like (e.g., a height greater than 0 nm and less than or equal to 5 nm) is formed over the gate insulating film 105 by a plasma CVD method, and plasma treatment in an atmosphere including oxygen or plasma oxidation is performed on the microcrystalline silicon grain; accordingly, a silicon oxide grain 57a having high crystallinity is formed over the gate insulating film 105. As the plasma treatment in an atmosphere including oxygen, N$_2$O plasma treatment may be used, for example. The formation of a microcrystalline silicon grain and the plasma treatment may be repeated as needed.

The silicon oxide grain 57a is formed over the gate insulating film 105 by forming the microcrystalline silicon grain over the gate insulating film 105 in this embodiment. However, a silicon oxide film (a SiO$_x$ film) having high crystallinity may be alternatively formed over the gate insulating film 105 by forming a microcrystalline silicon film or an amorphous silicon film having a thickness that allows the microcrystalline silicon film or the amorphous silicon film to be completely oxidized by later plasma oxidation or the like (e.g., a thickness greater than 0 nm and less than or equal to 5 nm) over the gate insulating film 105 by a plasma CVD method and performing plasma treatment in an atmosphere including oxygen or plasma oxidation on the microcrystalline silicon film or the amorphous silicon film. In the case of using an amorphous silicon film, it is preferable to use silicon in which crystallization is suppressed.

As the substrate 101, any of the substrates that can be used as the substrate 51 described in Embodiment 1 can be used as appropriate.

The gate electrode 103 can be formed in the following manner: a conductive film is formed over the substrate 101 by a sputtering method or a vacuum evaporation method using any metal material of Mo, Ti, Cr, Ta, W, Al, Cu, Nd, Sc, or Ni; a mask is formed over the conductive film by a photolithography method; and the conductive film is etched using the mask. In order to improve adhesion between the gate electrode 103 and the substrate 101, a nitride film of any of the above-described metal materials may be provided between the substrate 101 and the gate electrode 103. In this embodiment, a conductive film is formed over the substrate 101 and etched using a resist mask formed by a photolithography method.

Note that side surfaces of the gate electrode 103 are preferably tapered in order to prevent an insulating film, a silicon film, and a wiring formed over the gate electrode 103 in later steps from being cut at a step portion of the gate electrode 103. In order to taper the side surfaces of the gate electrode 103, etching may be performed while the resist mask is made to recede.

The gate insulating film 105 can be formed using any of insulating films that can be used as the insulating film 55 described in Embodiment 1 as appropriate.

The gate insulating film 105 can be formed by a CVD method, a sputtering method, or the like.

Figure 2B:
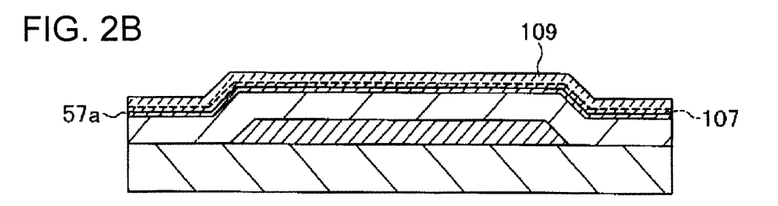

Next, as illustrated in FIG. 2B, a first microcrystalline silicon film 107 is formed over the silicon oxide grain 57a, and a second microcrystalline silicon film 109 is formed over the first microcrystalline silicon film 107.

Note that the thickness of the first microcrystalline silicon film 107 is preferably greater than or equal to 1 nm and less than or equal to 10 nm. The first microcrystalline silicon film 107 is formed in a treatment chamber of a plasma CVD apparatus, using plasma generated by glow discharge with the use of a mixture of a deposition gas containing silicon and hydrogen as a source gas. Alternatively, the first microcrystalline silicon film 107 is formed using plasma generated by glow discharge with the use of a mixture of a deposition gas containing silicon, hydrogen, and a rare gas such as helium, neon, or krypton. The distance between an upper electrode and a lower electrode of the plasma CVD apparatus is set to a distance which allows generation of plasma.

As typical examples of the deposition gas containing silicon, there are $SiH_4$, $Si_2H_6$, and the like.

In the case where a rare gas such as helium, argon, neon, krypton, or xenon is mixed into the source gas of the first microcrystalline silicon film 107, the deposition rate of the first microcrystalline silicon film 107 can be increased. Moreover, in the case where the deposition rate is increased, the amount of impurities mixed into the first microcrystalline silicon film 107 is reduced, so that the crystallinity of the first microcrystalline silicon film 107 can be improved. Accordingly, the on-state current and the field-effect mobility of the thin film transistor are increased and the throughput of the thin film transistor can also be increased.

In the glow discharge at the time of forming the first microcrystalline silicon film 107, the plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the ratio of the flow rate of hydrogen to the flow rate of the deposition gas containing silicon.

Note that the thickness of the second microcrystalline silicon film 109 is preferably greater than or equal to 30 nm and less than or equal to 100 nm. The second microcrystalline silicon film 109 is formed in a treatment chamber of the plasma CVD apparatus, using plasma generated by glow discharge with the use of a mixture of a deposition gas containing silicon and hydrogen as a source gas. Alternatively, the second microcrystalline silicon film 109 is formed using plasma generated by glow discharge with the use of a mixture of a deposition gas containing silicon, hydrogen, and a rare gas such as helium, neon, or krypton. The distance between an upper electrode and a lower electrode of the plasma CVD apparatus is set to a distance which allows generation of plasma.

In the case where a rare gas such as helium, argon, neon, krypton, or xenon is mixed into the source gas of the second microcrystalline silicon film 109, the crystallinity of the second microcrystalline silicon film 109 can be increased in a manner similar to that of the first microcrystalline silicon film 107. Accordingly, the on-state current and the field-effect mobility of the thin film transistor are increased and the throughput of the thin film transistor can also be increased.

The conditions for generating plasma by glow discharge at the time of forming the first microcrystalline silicon film 107 can be employed as appropriate as conditions for the second microcrystalline silicon film 109. In the case where the conditions for generating plasma by glow discharge at the time of forming the first microcrystalline silicon film 107 and those at the time of forming the second microcrystalline silicon film 109 are the same, throughput can be increased; however, they may be different from each other.

In this embodiment, the second microcrystalline silicon film 109 is a film which has low adhesion to a base and has a high field-effect mobility as compared to the first microcrystalline silicon film 107.

The first microcrystalline silicon film 107 and the second microcrystalline silicon film 109 are formed of microcrystalline silicon. The definition of the microcrystalline silicon is as described above.

Figure 2C:
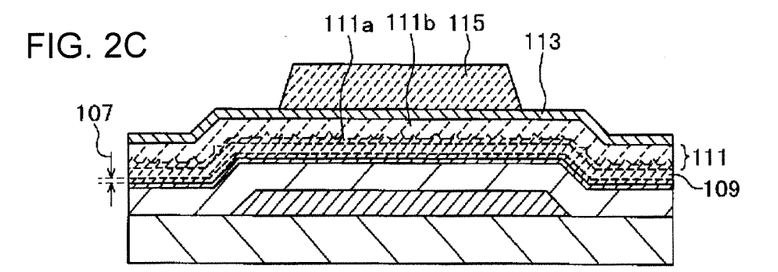

Next, as illustrated in FIG. 2C, a silicon film 111 is formed over the second microcrystalline silicon film 109. The silicon film 111 includes a microcrystalline silicon region 111a and a region 111b in which crystallization is suppressed. Next, an impurity silicon film 113 is formed over the silicon film 111. Then, a resist mask 115 is formed over the impurity silicon film 113.

The silicon film 111 including the microcrystalline silicon region 111a and the region 111b in which crystallization is suppressed can be formed under conditions which cause partial crystal growth using the second microcrystalline silicon film 109 as a seed crystal (conditions by which the crystal growth is reduced).

The silicon film 111 is formed in a treatment chamber of the plasma CVD apparatus, using plasma generated by glow discharge with the use of a mixture of a deposition gas containing silicon, hydrogen, and a gas containing nitrogen. As examples of the gas containing nitrogen, there are ammonia, nitrogen, nitrogen fluoride, nitrogen chloride, and the like. Generation of plasma by glow discharge can be performed in a manner similar to that of the first microcrystalline silicon film 107.

In that case, the ratio of the flow rate of hydrogen to the flow rate of the deposition gas containing silicon is set to a ratio for forming a microcrystalline silicon film in a manner similar to that in forming the first microcrystalline silicon film 107 or the second microcrystalline silicon film 109, and the gas containing nitrogen is used as a source gas, whereby the degree of crystal growth can be reduced as compared to those under the deposition conditions for the first microcrystalline silicon film 107 and the second microcrystalline silicon film 109. Specifically, at an early stage of deposition of the silicon film 111, the gas containing nitrogen included in the source gas partly suppresses the crystal growth, so that a conical microcrystalline silicon region or a pyramidal microcrystalline silicon region grows and a region in which crystallization is suppressed is formed. Further, at a middle stage or a later stage of the deposition, crystal growth of the conical or pyramidal microcrystalline silicon region stops, and only a region in which crystallization is suppressed is deposited. Accordingly, in the silicon film 111, the microcrystalline silicon region 111a and the region 111b in which crystallization is suppressed which is formed using a well-ordered silicon film having fewer defects and a steep tail of a level at a valence band edge, can be formed.

Here, a typical example of conditions for forming the silicon film 111 is as follows: the flow rate of hydrogen is 10 times to 2000 times, preferably 10 times to 200 times that of the deposition gas containing silicon. Note that in a typical example of conditions for forming a normal amorphous silicon film, the flow rate of hydrogen is 0 times to 5 times that of the deposition gas containing silicon.

In the case where a rare gas such as helium, neon, argon, xenon, or krypton is introduced into the source gas of the silicon film 111, the deposition rate can be increased.

It is preferable for the silicon film 111 to have a thickness of 50 nm to 350 nm, and further preferable for the silicon film 111 to have a thickness of 120 nm to 250 nm.

Figure 3A:
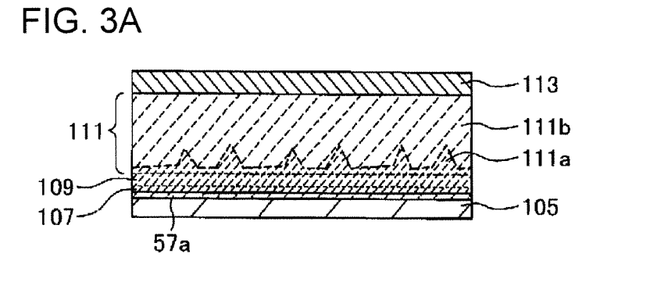
FIGS. 3A and 3B are cross-sectional views illustrating manufacturing methods of a semiconductor device according to one embodiment of the present invention.
Figure 3B:
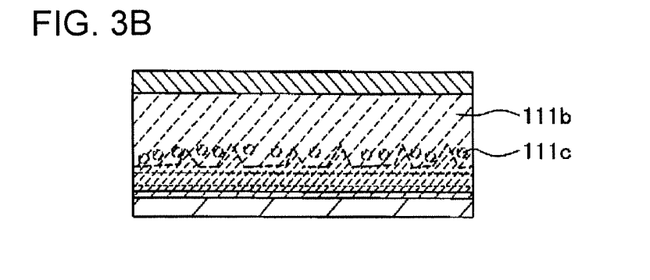

FIGS. 3A and 3B are enlarged views of the portion between the gate insulating film 105 and the impurity silicon film 113 illustrated in FIG. 2C.

As illustrated in FIG. 3A, the microcrystalline silicon region 111a in the silicon film 111 has a projection and a depression; and the projection has a conical or pyramidal shape whose width decreases from the gate insulating film 105 side toward the region 111b (in which crystallization is suppressed) side (a tip of the projection has an acute angle).

Alternatively, the microcrystalline silicon region 111a may have a projecting (inverted conical or pyramidal) shape whose width increases from the gate insulating film 105 side toward the region 111b (in which crystallization is suppressed) side.

By setting the thickness of the microcrystalline silicon region 111a, that is, the distance from the interface between the microcrystalline silicon region 111a and the gate insulating film 105 to the tip of the projection of the microcrystalline silicon region 111a to 5 nm or more and 310 nm or less, the off-state current of the thin film transistor can be reduced.

Further, in order to improve the crystallinity of the microcrystalline silicon region 111a, it is preferable that the concentration of oxygen and nitrogen contained in the silicon film 111, which is measured by secondary ion mass spectrometry, be less than $1 \times 10^{18}$ atoms/cm$^3$.

The region 111b in which crystallization is suppressed is formed of an amorphous semiconductor containing nitrogen. The nitrogen in the amorphous semiconductor containing nitrogen may exist, for example, as an NH group or an $NH_2$ group. As the amorphous semiconductor, amorphous silicon can be used.

Silicon in which crystallization is suppressed is a semiconductor having lower energy at an Urbach edge that is measured by a constant photocurrent method (CPM) or photoluminescence spectroscopy and a smaller amount of defect absorption spectrum, as compared to a conventional amorphous semiconductor. In other words, as compared to the conventional amorphous semiconductor, the silicon in which crystallization is suppressed is a well-ordered semiconductor which has few defects and whose tail of a level at a valence band edge is steep. Since the silicon in which crystallization is suppressed has a steep tail of a level at a valence band edge, the band gap is wide and tunnel current does not flow easily. Therefore, when the silicon in which crystallization is suppressed is provided between the microcrystalline silicon region 111a and the impurity silicon film 113, the off-state current of the thin film transistor can be reduced. In addition, by provision of the silicon in which crystallization is suppressed, the on-state current and the field-effect mobility can be increased.

Further, the peak region of a spectrum of the silicon in which crystallization is suppressed that is measured by low-temperature photoluminescence spectroscopy is higher than or equal to 1.31 eV and lower than or equal to 1.39 eV. Note that the peak region of a spectrum of microcrystalline silicon, which is measured by low-temperature photoluminescence spectroscopy, is higher than or equal to 0.98 eV and lower than or equal to 1.02 eV. Accordingly, the silicon in which crystallization is suppressed is different from microcrystalline silicon.

The microcrystalline silicon region 111a, as well as the region 111b in which crystallization is suppressed, may include a NH group or an $NH_2$ group.

Further, as illustrated in FIG. 3B, a silicon crystal grain 111c whose grain size is greater than or equal to 1 nm and less than or equal to 10 nm, preferably greater than or equal to 1 nm and less than or equal to 5 nm may be included in the region 111b in which crystallization is suppressed, so that the on-state current and the filed-effect mobility can be further increased.

The microcrystalline silicon having a projecting (conical or pyramidal) shape whose width decreases from the gate insulating film 105 side toward the region 111b (in which crystallization is suppressed) side is formed in the following manner: after the second microcrystalline silicon film is formed under the deposition conditions for microcrystalline silicon, crystal growth is caused on such conditions that the crystal growth is reduced, and amorphous silicon is deposited.

Since the microcrystalline silicon region 111a in the silicon film 111 has the conical or pyramidal shape or the inverted conical or pyramidal shape, resistance in a vertical direction (film thickness direction) of when voltage is applied between a source and drain electrodes in an on state, i.e., the resistance of the silicon film 111 can be lowered. Further, tunnel current does not easily flow since silicon in which crystallization is suppressed is provided between the microcrystalline silicon region 111a and the impurity silicon film 113. The silicon in which crystallization is suppressed is a well-ordered semiconductor having few defects and a steep tail of a level at a valence band edge. Thus, in the thin film transistor described in this embodiment, the on-state current and the field-effect mobility can be increased and the off-state current can be reduced.

The impurity silicon film 113 is formed using amorphous silicon to which phosphorus is added, microcrystalline silicon to which phosphorus is added, or the like. A structure in which amorphous silicon to which phosphorus is added and microcrystalline silicon to which phosphorus is added are stacked can also be employed. In the case of forming a p-channel thin film transistor as a thin film transistor, the impurity silicon film 113 is formed using microcrystalline silicon to which boron is added, amorphous silicon to which boron is added, or the like.

The impurity silicon film 113 is formed in a treatment chamber of the plasma CVD apparatus, using plasma generated by glow discharge with the use of a mixture of a deposition gas containing silicon, hydrogen, and phosphine (diluted with hydrogen or silane) as a source gas. The deposition gas containing silicon is diluted with hydrogen, in formation of amorphous silicon to which phosphorus is added or microcrystalline silicon to which phosphorus is added. In the case of manufacturing a p-channel thin film transistor, the impurity silicon film 113 may be formed using plasma generated by glow discharge using diborane instead of phosphine.

The resist mask 115 can be formed by a photolithography step.

Figure 2D:
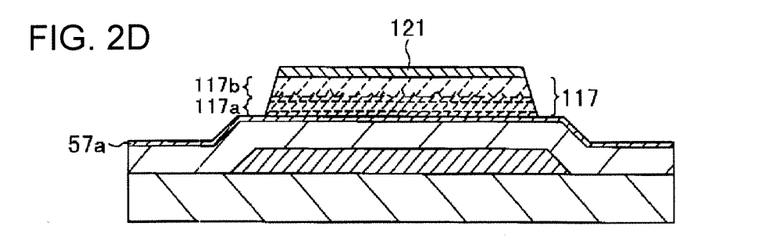

Next, as illustrated in FIG. 2D, the first microcrystalline silicon film 107, the second microcrystalline silicon film 109, the silicon film 111, and the impurity silicon film 113 are etched using the resist mask 115. By this step, the first microcrystalline silicon film 107, the second microcrystalline silicon film 109, the silicon film 111, and the impurity silicon film 113 are divided into elements, so that a silicon stacked body 117 and an impurity silicon film 121 are formed. The silicon stacked body 117 includes part of the first microcrystalline silicon film 107, part of the second microcrystalline silicon film 109, and part of the silicon film 111. The silicon stacked body 117 is constituted of a microcrystalline silicon region 117a which includes part of the first microcrystalline silicon film 107, part of the second microcrystalline silicon film 109, and part of the microcrystalline silicon region of the silicon film 111 and a region 117b in which crystallization is suppressed, which includes part of the region of the silicon film 111, in which crystallization is suppressed. Then, the resist mask 115 is removed.

Figure 4A:
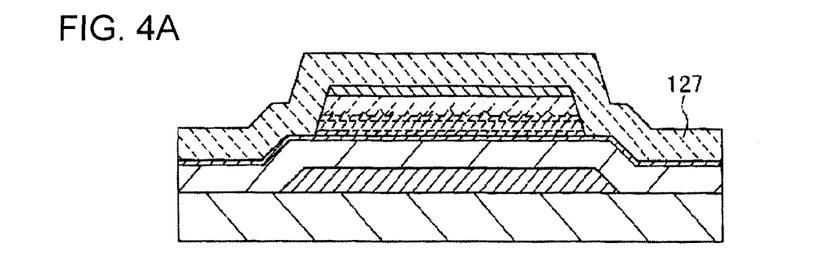
FIGS. 4A to 4C are cross-sectional views illustrating a manufacturing method of a semiconductor device according to one embodiment of the present invention.

Next, as illustrated in FIG. 4A, a conductive film 127 is formed over the impurity silicon film 121. The conductive film 127 is formed by a CVD method, a sputtering method, or a vacuum evaporation method.

Figure 4B:
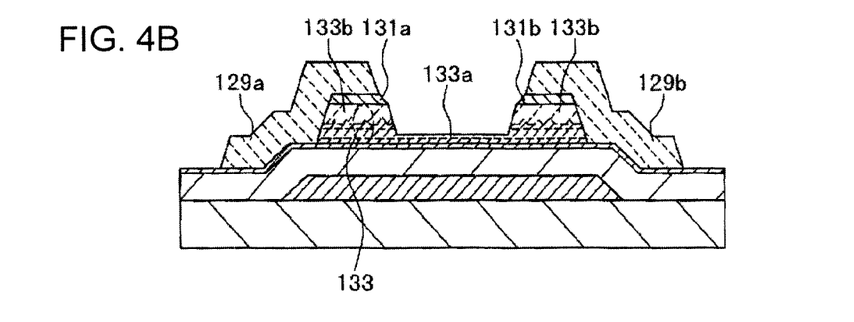

Next, as illustrated in FIG. 4B, wirings 129a and 129b functioning as a source electrode and a drain electrode are formed by forming a resist mask (not illustrated) by a photolithography step and etching the conductive film 127 with the use of the resist mask. The etching of the conductive film 127 may be either dry etching or wet etching. Note that one of the wirings 129a and 129b functions as a signal line as well as a source electrode or a drain electrode. However, without limitation thereto, a signal line may be provided separately from the source and drain electrodes.

Next, the impurity silicon film 121 and the silicon stacked body 117 are partly etched, so that a pair of impurity silicon films 131a and 131b functioning as a source and drain regions are formed. A silicon stacked body 133 including a microcrystalline silicon region 133a and a pair of regions 133b in which crystallization is suppressed is formed. At this time, the silicon stacked body 117 is etched so as to expose the microcrystalline silicon region 133a, so that the silicon stacked body 133 is formed in which the microcrystalline silicon region 133a and the regions 133b in which crystallization is suppressed are stacked in regions covered with the wirings 129a and 129b, and the microcrystalline silicon region 133a is exposed in part of a region not covered with the wiring 129a or the wiring 129b but overlapping with the gate electrode.

Next, dry etching may be performed. As conditions for the dry etching, conditions by which the exposed microcrystalline silicon region 133a and the exposed regions 133b in which crystallization is suppressed are not damaged and in which the etching rate of the microcrystalline silicon region 133a and the regions 133b in which crystallization is suppressed is low are used. That is, conditions by which surfaces of the exposed microcrystalline silicon region 133a and the exposed regions 133b in which crystallization is suppressed are hardly damaged and by which the thicknesses of the exposed microcrystalline silicon region 133a and the exposed regions 133b in which crystallization is suppressed are hardly reduced are used. As an etching gas, $Cl_2$, $CF_4$, $N_2$, or the like is typically used.

Then, plasma treatment is performed on the surfaces of the microcrystalline silicon region 133a and the regions 133b in which crystallization is suppressed.

After the plasma treatment, the resist mask is removed (see FIG. 4B). The resist mask may be removed before the dry etching on the impurity silicon film 121 and the silicon stacked body 117.

As described above, after the microcrystalline silicon region 133a and the regions 133b in which crystallization is suppressed are formed, dry etching is further performed under such conditions that the microcrystalline semiconductor region 133a and the regions 133b in which crystallization is suppressed are not damaged, whereby an impurity such as a residue existing on the exposed microcrystalline semiconductor region 133a and the exposed regions 133b in which crystallization is suppressed can be removed. By the plasma treatment, insulation between the source region and the drain region can be ensured, and thus, in a thin film transistor which is completed, off-state current can be reduced, and variation in electric characteristics can be reduced.

Through the above-described process, a single-gate thin film transistor can be manufactured. A single-gate thin film transistor with low off-state current, high on-state current, and high field-effect mobility can be manufactured with high productivity.

In this embodiment, by performing the plasma treatment in an atmosphere including oxygen or the plasma oxidation on the microcrystalline silicon grain, the silicon oxide grain 57a having high crystallinity can be formed over the gate insulating film 105. Then, the first microcrystalline silicon film 107 is formed over the silicon oxide grain 57a having high crystallinity, so that a contact portion at the interface between the gate insulating film 105 and the first microcrystalline silicon film 107 can be well-ordered. Accordingly, the adhesion force or the adhesion between the gate insulating film 105 and the first microcrystalline silicon film 107 can be increased or improved. As the result, a film bulge or film peeling of the first microcrystalline silicon film 107 and the second microcrystalline silicon film 109 hardly occurs.

Since the first microcrystalline silicon film 107 is formed by the growth of the silicon oxide grain 57a which is an insulating film having high crystallinity, high crystallinity can be obtained from the initial stage of the growth. Accordingly, electric characteristics such as the threshold voltage of the thin film transistor can be shifted to the normally-off side.

Note that in this embodiment, a thin film transistor whose gate electrode is located below a channel region has been described as a semiconductor device according to an embodiment of the present invention; however, the present invention may also be applied to a dual-gate thin film transistor whose back gate is located above a channel region as a semiconductor device according to an embodiment of the present invention.

Figure 4C:
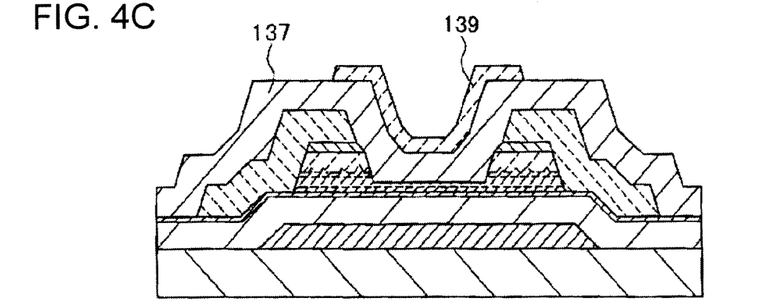

Next, an insulating film 137 is formed over the silicon stacked body 133 and the wirings 129a and 129b. The insulating film 137 can be formed in a manner similar to that for the gate insulating film 105.

Next, an opening (not illustrated) is formed in the insulating film 137 with the use of a resist mask formed by a photolithography step. A back gate electrode 139 is formed over the insulating film 137 (see FIG. 4C). Through the above-described process, a dual-gate thin film transistor can be manufactured. Note that although the opening is formed in the insulating film 137 in this embodiment, the formation of this opening is not a requisite step and can be omitted.

The back gate electrode 139 can be formed in a manner similar to that of the wirings 129a and 129b. Alternatively, the back gate electrode 139 can be formed using a light-transmitting conductive material.

The back gate electrode 139 can be formed in parallel to the gate electrode 103. In this case, each of potential applied to the back gate electrode 139 and potential applied to the gate electrode 103 can be controlled independently. Thus, the threshold voltage of the thin film transistor can be controlled. Further, regions in which carriers flow, that is, channel regions, are formed on the gate insulating film 105 side and on the insulating film 137 side in the microcrystalline silicon region; thus, the on-state current of the thin film transistor can be increased.

The back gate electrode 139 can be connected to the gate electrode 103. That is, the gate electrode 103 and the back gate electrode 139 can be connected through an opening (not illustrated) formed in the gate insulating film 105 and the insulating film 137. In this case, potential applied to the back gate electrode 139 and potential applied to the gate electrode 103 are equal. As a result, in the silicon film, regions in which carriers flow, that is, channel regions are formed on the gate insulating film 105 side and on the insulating film 137 side in the microcrystalline silicon region; thus, the on-state current of the thin film transistor can be increased.

Further alternatively, the back gate electrode 139 may be in a floating state without being connected to the gate electrode 103. In that case, channel regions are formed on the gate insulating film 105 side and on the insulating film 137 side in the microcrystalline silicon region without a voltage applied to the back gate electrode 139; thus, the on-state current of the thin film transistor can be increased.

Further, the back gate electrode 139 may overlap with the wirings 129a and 129b with the insulating film 137 provided therebetween.

Through the above-described process, a single-gate thin film transistor and a dual-gate thin film transistor having high on-state current, high field-effect mobility, and low off-state current can be manufactured.

[Embodiment 3]

Figure 5:
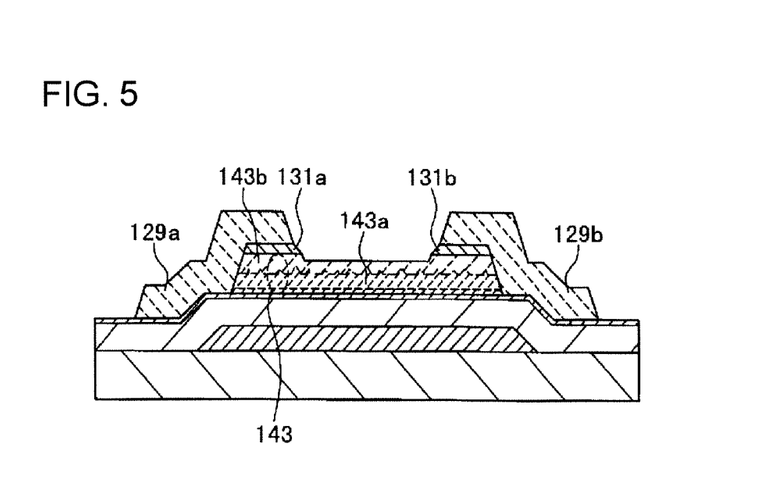
FIG. 5 is a cross-sectional view illustrating a manufacturing method of a semiconductor device according to one embodiment of the present invention.

In this embodiment, a manufacturing method of a thin film transistor formed in a semiconductor device that is an embodiment of the present invention will be described with reference to FIG. 5. FIG. 5 corresponds to the step illustrated in FIG. 4B.

In a manner similar to that of Embodiment 2, a conductive film 127 is formed through the process of FIGS. 2A to 2D and FIG. 3A.

Then, as illustrated in FIG. 5, wirings 129a and 129b are formed and an impurity silicon film 121 and a silicon stacked body 117 are partly etched, so that a pair of impurity silicon films 131a and 131b serving as a source region and a drain region are formed in a manner similar to that of Embodiment 2. A silicon stacked body 143 including a microcrystalline silicon region 143a and a region 143b in which crystallization is suppressed is formed. At this time, the silicon stacked body 117 is etched so as to expose the region 143b in which crystallization is suppressed, so that the silicon stacked body 143 is formed in which the microcrystalline silicon region 143a and the region 143b in which crystallization is suppressed are stacked in regions covered with the wirings 129a and 129b and in which the microcrystalline silicon region 143a is not exposed and the region 143b in which crystallization is suppressed is exposed in a region not covered with the wiring 129a or the wiring 129b and overlapping with the gate electrode. Note that the etching amount of the silicon stacked body 117 is smaller than that in the case of FIG. 4B.

A subsequent process is similar to that of Embodiment 2. Through the above-described process, a single-gate thin film transistor can be manufactured. Since the back channel side of the thin film transistor is amorphous, the off-state current can be reduced as compared to the thin film transistor illustrated in FIG. 4B.

Further in this embodiment, after the step illustrated in FIG. 5, a back gate electrode 139 may or may not be formed over an insulating film 137 as in the step illustrated in FIG. 4C.

EXAMPLE

In this example, evaluation results of the reliability of the transistor illustrated in FIG. 4C will be described. Details of transistors used in this example (here, Sample A and Sample B are manufactured) are described below.

A base film is formed of SiON to a thickness of 200 nm over a substrate 101 by a plasma CVD method. Then, a gate electrode 103 is formed over the base film by a sputtering method. This gate electrode 103 is a stacked film of Ti with a thickness of 50 nm, Al with a thickness of 100 nm, and Ti with a thickness of 50 nm.

Next, a gate insulating film 105 with a thickness of 300 nm is formed of a silicon nitride film (a $SiN_x$ film) by a plasma CVD method to cover the gate electrode 103, and a surface of the gate insulating film 105 is subjected to plasma treatment in an atmosphere including oxygen. This plasma treatment is performed by introducing only $N_2O$ into a chamber.

Next, a microcrystalline silicon grain with a height of approximately 1 nm is formed over the gate insulating film 105 by a plasma CVD method using a mixed gas of monosilane, hydrogen, and argon. This formation step of the microcrystalline silicon grain is performed only on Sample B, not on Sample A. By performing the plasma treatment in an atmosphere including oxygen on this microcrystalline silicon grain, the silicon oxide grain 57a is formed over the gate insulating film 105. The plasma treatment here is performed under the same conditions as those of the above-described gate insulating film 105. The formation step of the silicon oxide grain 57a is also performed only on Sample B, not on Sample A. Note that the steps from the formation of the above-described gate insulating film 105 to the formation of the silicon oxide grain 57a are performed in the same chamber.

Next, a first microcrystalline silicon film 107 with a thickness of 5 nm is formed over the silicon oxide grain 57a by a plasma CVD method using a mixed gas of monosilane, hydrogen, and argon. Then, a second microcrystalline silicon film 109 with a thickness of 65 nm is formed over the first microcrystalline silicon film 107 by a plasma CVD method using a mixed gas of monosilane, hydrogen, and argon.

Next, a silicon film 111 with a thickness of 80 nm is formed over the second microcrystalline silicon film 109 by a plasma CVD method using a mixed gas of monosilane, ammonia diluted with hydrogen, hydrogen, and argon. Here, ammonia diluted with hydrogen is a gas in which ammonia is diluted with hydrogen to 1000 ppm.

Then, an impurity silicon film 113 with a thickness of 50 nm is formed over the silicon film 111 by a plasma CVD method using a mixed gas of monosilane, phosphine diluted with hydrogen, and hydrogen. Here, phosphine diluted with hydrogen is a gas in which phosphine is diluted with hydrogen to 0.5%. Detailed formation conditions of the impurity silicon film 113 and characteristic comparison are shown in Table 1 and Table 2.

TABLE 1

| | Gas flow rate (sccm) | | | | | Pressure (Pa) | Power (W) | Electrode tem. (°C.) Upper/Lower | Distance between electrodes (mm) |
|---|---|---|---|---|---|---|---|---|---|
| | $SiH_4$ | $H_2$ | Ar | $NH_3/H_2$ | $PH_3/H_2$ | | | | |
| Microcrystalline silicon grain | 4 | 750 | 750 | — | — | 532 | 150 | 250/290 | 15 |
| First microcrystalline silicon film 107 | 4 | 750 | 750 | — | — | 532 | 150 | 250/290 | 15 |
| Second microcrystalline silicon film 109 | 1.8 | 750 | 750 | — | — | 5000 | 125 | 250/290 | 7 |
| Silicon film 111 | 20 | 700 | 750 | 50 | — | 350 | 60 | 250/290 | 25 |
| Impurity silicon film 113 | 80 | 750 | — | — | 150 | 350 | 30 | 250/290 | 15 |

TABLE 2

|  |  | Sample A | Sample B |
|---|---|---|---|
| Ion (Vg = 15 V) | [µA] | 15.69 | 15.14 |
| Ioff (min.) | [pA] | 1.06 | 2.28 |
| Ioff (min −10 V) | [pA] | 13.63 | 22.23 |
| Ion (Vg = 15 V)/Ioff (min.) | [Digits] | 7.38 | 7.17 |
| Vth | [V] | 1.02 ± 0.22 | 1.42 ± 0.26 |
| S-value | [V/dec.] | 0.23 | 0.26 |
| µFE_sat. | [cm$^2$/Vs] | 1.56 | 1.54 |
| +Gate BT (85° C., Vg = +20 V, Vd = 0.1 V) | ΔVth [V] | 1.25 | 1.49 |
| −Gate BT (85° C., Vg = −20 V, Vd = 0.1 V) | ΔVth [V] | −1.17 | −0.55 |

In Table 2, "Ion" is current flowing between a source and a drain in an on state of the TFT, "Vg=15 V" means Vgs=15 V, "Vd=0.1 V" means Vds=0.1 V, Ioff is current flowing between a source and a drain in an off state of the TFT, "min." means minimum, "−10 V" means Vgs=−10 V, Vth is a threshold voltage of the TFT, S-value is a subthreshold value, µFE_sat. is a mobility in a saturation region, and ΔVth is the amount of Vth change by the test. The S-value refers to a gate voltage necessary for increasing one digit of Ids, and smaller S-value means higher switching characteristics. Vgs is a potential difference between the potential of a gate and the potential of a source when the potential of the source is used as a reference potential. Vds is a potential difference between the potential of a drain and the potential of a source when the potential of the source is used as a reference potential.

Next, the first microcrystalline silicon film 107, the second microcrystalline silicon film 109, the silicon film 111, and the impurity silicon film 113 are etched to form a silicon stacked body 117 and an impurity silicon film 121. Side surfaces of the silicon stacked body 117 are oxidized. This oxidation is conducted by plasma treatment in which only oxygen is introduced into a chamber after the etching.

Then, a conductive film 127 to be processed into wirings 129a and 129b is formed over the impurity silicon film 121. This conductive film 127 is a stacked film of Ti with a thickness of 50 nm, Al with a thickness of 200 nm, and Ti with a thickness of 50 nm. In this manner, Sample A and Sample B are manufactured.

One of methods for examining reliability of transistors is a bias-temperature stress test (hereinafter referred to as a gate BT test). The gate BT test is one kind of accelerated test and can evaluate change in characteristics, caused by long-term usage, of transistors in a short time. In particular, the amount of change in threshold voltage of the transistor between before and after the gate BT test is an important indicator for examining the reliability. Between before and after the gate BT test, the smaller amount of change in threshold voltage means higher reliability.

Specifically, the temperature of a substrate over which a transistor is formed (substrate temperature) is set at fixed temperature, the potentials of a source and a drain of the transistor are set to be almost equal, and a gate is supplied with a potential different from those of the source and the drain for a certain period. The substrate temperature may be set as appropriate in accordance with the purpose of the test. The test in the case where the potential applied to the gate is higher than the potentials of the source and the drain is referred to as a positive gate BT test, and the test in the case where the potential applied to the gate is lower than the potentials of the source and the drain is referred to as a negative gate BT test.

The stress conditions for the gate BT test can be determined by setting the substrate temperature, the electric field intensity applied to a gate insulating film, or the time period of application of an electric field. The electric field intensity applied to a gate insulating film can be determined by dividing the potential difference between the gate potential and the source and drain potential by the thickness of the gate insulating film. For example, in the case where the electric field intensity applied to the 100-nm-thick gate insulating film is set to 2 MV/cm, the potential difference may be set to 20 V.

Note that "voltage" generally indicates a difference between potentials of two points, and "potential" indicates a static electric energy (electrical potential energy) unit charge which is at a point in a static electric field has. However, in an electronic circuit, a difference between a potential at a certain point and a reference potential (e.g., a ground potential) is often referred to as the potential at a certain point. Thus, in the following description, when a difference between a potential at a certain point and a reference potential (e.g., a ground potential) is referred to as the potential at a certain point, the potential at a certain point means the voltage except for the case where definition is particularly given.

As the gate BT test, the positive gate BT test and the negative gate BT test were performed under such conditions that the substrate temperature was 85° C., the electric field intensity applied to a gate insulating film was 2/3 (MV/cm), and the time period for application was 12 hours.

First, the positive gate BT test is described. In order to measure initial characteristics of the transistors subjected to the gate BT test, a change in characteristics of the source-drain current (hereinafter referred to as the drain current) was measured under conditions where the substrate temperature was set to 85° C., the voltage between the source and the drain (hereinafter, the drain voltage) was set to 1 V or 10 V, and the voltage between the source and the gate (hereinafter, the gate voltage) was changed in the range of −30 V to +30 V. That is, Vg-Id characteristics at drain voltages of 1 V and 10 V were measured.

Next, the substrate temperature was increased to 85° C., and then, the potential of the source of the transistor was set to a ground potential and the potential of the drain was set to 0.1 V. After that, the gate voltage was applied so that the electric field intensity applied to the gate insulating film was 2/3(MV/cm). In this case, the thickness of the gate insulating film of the transistor was 300 nm. The gate was supplied with +20 V of voltage, and the gate supplied with the voltage was kept for 12 hours. Note that the period in which the voltage is kept may be changed as appropriate in accordance with the purpose.

Figure 6A:
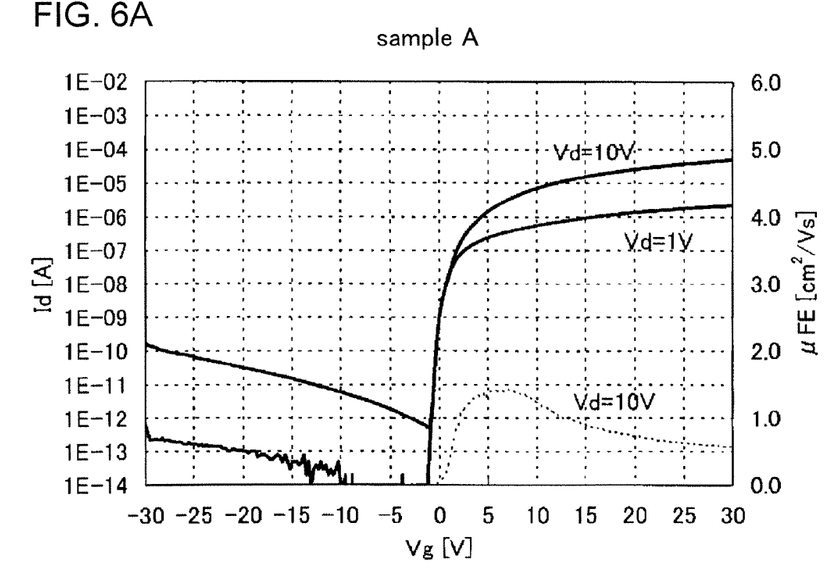
FIGS. 6A and 6B show Vg-Id characteristics of Sample A and Sample B after positive gate BT test.
Figure 6B:
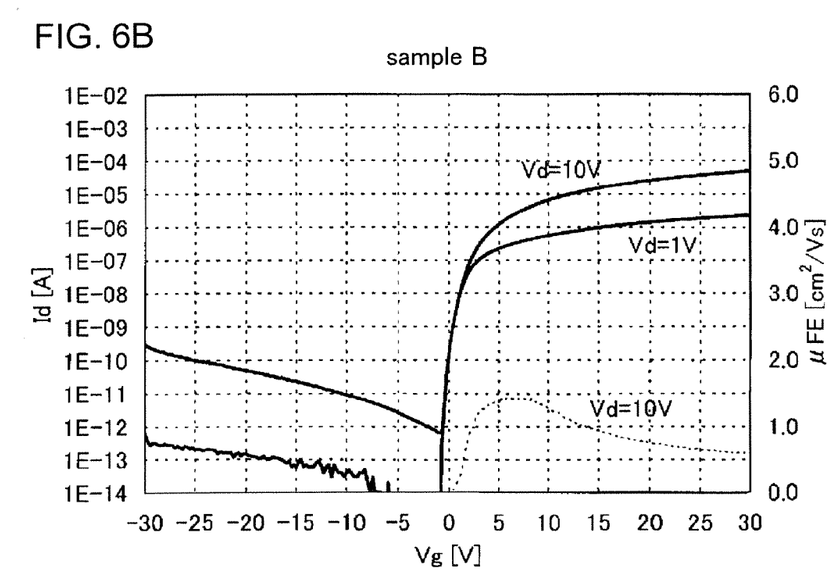

Then, Vg-Id characteristics were measured under the same conditions as those of the measurement of the initial characteristics, and Vg-Id characteristics after the positive gate BT test were obtained. The results are shown in FIGS. 6A and 6B.

In the gate BT test, it is important to use a transistor which has been never subjected to a gate BT test. For example, if the negative gate BT test is performed on a transistor which has been once subjected to the positive gate BT test, the results of the negative gate BT test cannot be evaluated correctly due to the influence of the positive gate BT test which has been performed previously. Further, the same applies to the case where positive gate BT test is performed on a transistor which has been once subjected to the positive gate BT test. Note that the same does not apply to the case where the gate BT test is intentionally repeated in consideration of these influences.

As for ΔVth by the negative gate BT test, ΔVth of Sample B (ΔVth=−0.55 V) is reduced to a value smaller than half of ΔVth of Sample A (ΔVth=−1.17 V).

Figure 7A:
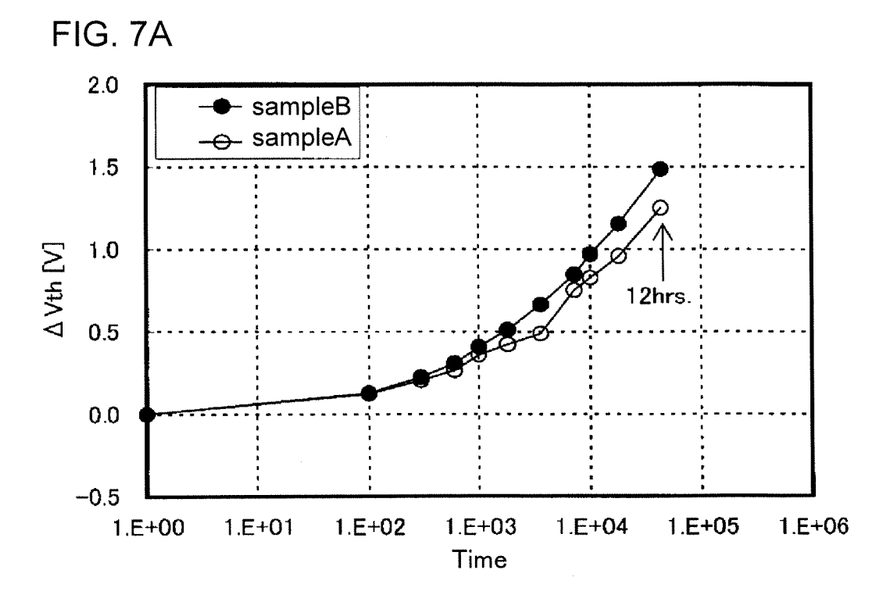
FIGS. 7A and 7B show time dependence of a change of ΔVth by gate BT test.
Figure 7B:
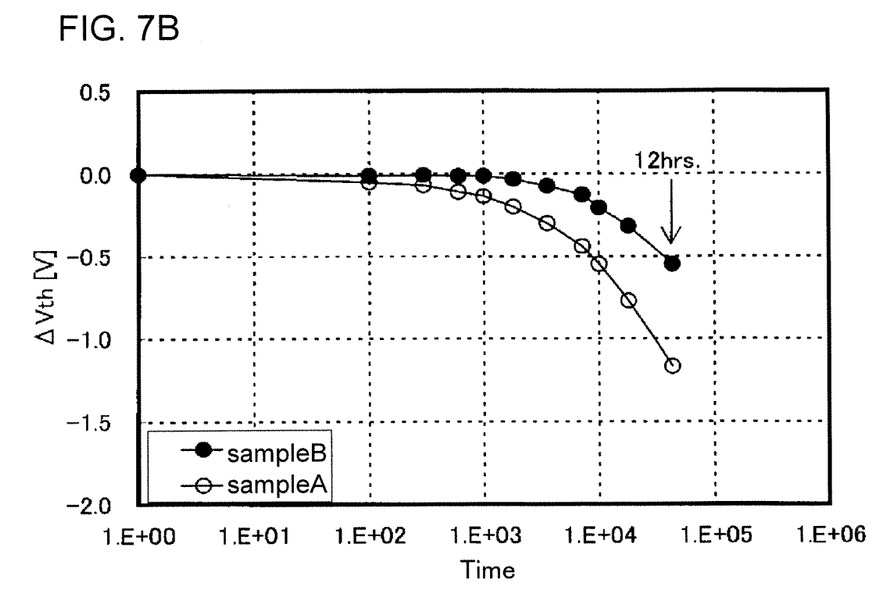

FIGS. 7A and 7B show time dependence of the change in ΔVth by the gate test. According to FIGS. 7A and 7B, it is found that the amount of change in ΔVth by the negative gate BT test of Sample B is smaller than that of Sample A and the amount of change in ΔVth of Sample A is small. On the other hand, the amount of change in ΔVth by the positive gate BT test of Sample A is smaller than that of Sample B, but this difference is not a significant difference and is within the variation.

As described above in this example, with one embodiment of the present invention, ΔVth by the negative gate BT test can be improved.

Note that the transistor having high reliability in the negative gate BT test as described above can be applied to both a pixel transistor of a display device and a transistor of a driver circuit in a driver circuit portion of a display device.

EXPLANATION OF REFERENCES

51: substrate, 55: insulating film, 57a: silicon oxide grain, 59: microcrystalline silicon film, 101: substrate, 103: gate electrode, 105: gate insulating film, 107: first microcrystalline silicon film, 109: second microcrystalline silicon film, 111: silicon film, 111a: microcrystalline silicon region, 111b: region in which crystallization is suppressed, 111c: silicon crystal grain, 113: impurity silicon film, 115: resist mask, 117: silicon stacked body, 117a: microcrystalline silicon region, 117b: region in which crystallization is suppressed, 121: impurity silicon film, 127: conductive film, 129a, 129b: wiring, 131a, 131b: impurity silicon film, 133: silicon stacked body, 133a: microcrystalline silicon region, 133b: region in which crystallization is suppressed, 137: insulating film, 139: back gate electrode, 143: silicon stacked body, 143a: microcrystalline silicon region, and 143b: region in which crystallization is suppressed.

This application is based on Japanese Patent Application serial No. 2010-177922 filed with Japan Patent Office on Aug. 6, 2010, the entire contents of which are hereby incorporated by reference.

The invention claimed is:

1. A manufacturing method of a microcrystalline silicon film, comprising the steps of:

forming, over an insulating film, a microcrystalline silicon grain having a height that allows the microcrystalline silicon grain to be completely oxidized by later plasma oxidation, or a microcrystalline silicon film or an amorphous silicon film having a thickness that allows the microcrystalline silicon film or the amorphous silicon film to be completely oxidized by later plasma oxidation;

performing plasma treatment in an atmosphere including oxygen on the microcrystalline silicon grain, the microcrystalline silicon film, or the amorphous silicon film, so that a silicon oxide grain or a silicon oxide film is formed over the insulating film; and forming a microcrystalline silicon film over the silicon oxide grain or the silicon oxide film.

2. The manufacturing method of a microcrystalline silicon film according to claim 1, wherein the insulating film is a single-layer film or a stacked film including any of a silicon nitride film or a silicon nitride oxide film.

3. A manufacturing method of a thin film transistor, comprising the steps of:

forming a gate insulating film over a gate electrode;

forming, over the gate insulating film, a microcrystalline silicon grain having a height that allows the microcrystalline silicon grain to be completely oxidized by later plasma oxidation, or a microcrystalline silicon film or an amorphous silicon film having a thickness that allows the microcrystalline silicon film or the amorphous silicon film to be completely oxidized by later plasma oxidation;

performing plasma treatment in an atmosphere including oxygen on the microcrystalline silicon grain, the microcrystalline silicon film, or the amorphous silicon film, so that a silicon oxide grain or a silicon oxide film is formed over the gate insulating film; and forming a microcrystalline silicon film over the silicon oxide grain or the silicon oxide film.

4. The manufacturing method of a thin film transistor according to claim 3, wherein the gate insulating film is a single-layer film or a stacked film including any of a silicon nitride film or a silicon nitride oxide film.

* * * * *